United States Patent
Yeh et al.

(10) Patent No.: US 10,638,078 B2
(45) Date of Patent: Apr. 28, 2020

(54) COUNTER, COUNTING METHOD AND APPARATUS FOR IMAGE SENSING

(71) Applicant: Taiwan Semiconductor Manufacturing Co., Ltd., Hsinchu (TW)

(72) Inventors: Shang-Fu Yeh, Hsinchu (TW); Kuo-Yu Chou, Hsinchu (TW); Calvin Yi-Ping Chao, Hsinchu County (TW); Chih-Lin Lee, Miaoli County (TW); Chin Yin, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 70 days.

(21) Appl. No.: 15/995,143

(22) Filed: Jun. 1, 2018

(65) Prior Publication Data

US 2019/0373200 A1    Dec. 5, 2019

(51) Int. Cl.
| | |
|---|---|
| H04N 5/374 | (2011.01) |
| H04N 5/376 | (2011.01) |
| H03M 1/00 | (2006.01) |
| H04N 5/3745 | (2011.01) |
| H04N 5/378 | (2011.01) |

(52) U.S. Cl.
CPC .......... *H04N 5/3765* (2013.01); *H03M 1/007* (2013.01); *H04N 5/378* (2013.01); *H04N 5/3745* (2013.01)

(58) Field of Classification Search
CPC ..................................................... H03M 1/825
USPC ........................ 250/208.1; 341/169; 348/294
See application file for complete search history.

(56) References Cited

U.S. PATENT DOCUMENTS

| | | | |
|---|---|---|---|
| 5,940,467 A * | 8/1999 | Fransson | H03K 21/00 377/47 |
| 9,674,471 B1 * | 6/2017 | Boemler | H04N 5/37455 |
| 2011/0187907 A1 * | 8/2011 | Takahashi | H01L 27/146 348/302 |
| 2013/0182157 A1 * | 7/2013 | Ono | H04N 5/335 348/294 |

\* cited by examiner

*Primary Examiner* — Anthony J Daniels
(74) *Attorney, Agent, or Firm* — JCIPRNET (57) ABSTRACT

A counter, a counting method and an apparatus for image sensing are introduced in the present disclosure. The counter includes a plurality of dual phase clock generators and a plurality of column counters. Each of the plurality of dual phase clock generator receives a common clock signal and generates dual phase clock signals which comprise a first clock signal and a second clock signal according to the common clock signal. Each of the plurality of column counters is coupled to one of the plurality of dual phase clock generators to receive the first clock signal and the second clock signal, and is configured to output a counting value according to the first clock signal and the second clock signal. Each of the plurality of dual phase clock generators provides the first clock signal and the second clock signal to a group of the plurality of column counters.

17 Claims, 11 Drawing Sheets

| va1 | vb1 | va2 | vb2 | va3 | vb3 | D$_{LSB}$ |
|---|---|---|---|---|---|---|
| 0 | 0 | \multicolumn{2}{c|}{00} | 0 | 0 | 0 |
| 0 | 1 | | | 0 | 1 | 1 |
| 1 | 1 | | | 1 | 1 | 2 |
| 1 | 0 | | | 1 | 0 | 3 |
| 0 | 0 | \multicolumn{2}{c|}{01} | 0 | 1 | 1 |
| 0 | 1 | | | 1 | 1 | 2 |
| 1 | 1 | | | 1 | 0 | 3 |
| 1 | 0 | | | 0 | 0 | 0 |
| 0 | 0 | \multicolumn{2}{c|}{11} | 1 | 1 | 2 |
| 0 | 1 | | | 1 | 0 | 3 |
| 1 | 1 | | | 0 | 0 | 0 |
| 1 | 0 | | | 0 | 1 | 1 |
| 0 | 0 | \multicolumn{2}{c|}{10} | 1 | 0 | 3 |
| 0 | 1 | | | 0 | 0 | 0 |
| 1 | 1 | | | 0 | 1 | 1 |
| 1 | 0 | | | 1 | 1 | 2 |

COUNTER, COUNTING METHOD AND APPARATUS FOR IMAGE SENSING

BACKGROUND

Analog-to-digital converters (ADCs) are commonly used in electronic devices, especially in the field of image sensing or image sensor. Complementary metal-oxide-semiconductor (CMOS) image sensors (CIS) have been adopted and proliferated in many popular electronic devices; and the CIS is configured with ADCs.

Each of the ADCs may include a counter such as a ripple counter for outputting a counting value in a sampling operation of the ADC. However, the ripple counter's speed is limited to few hundred MHz because of huge peak, average current, and power/ground metal IR drop. As a resolution of image sensor increases, the counter's speed is expected to be higher to satisfy the market's demands. In addition, power consumption of the counter and the ADCs is another issue that need to be concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
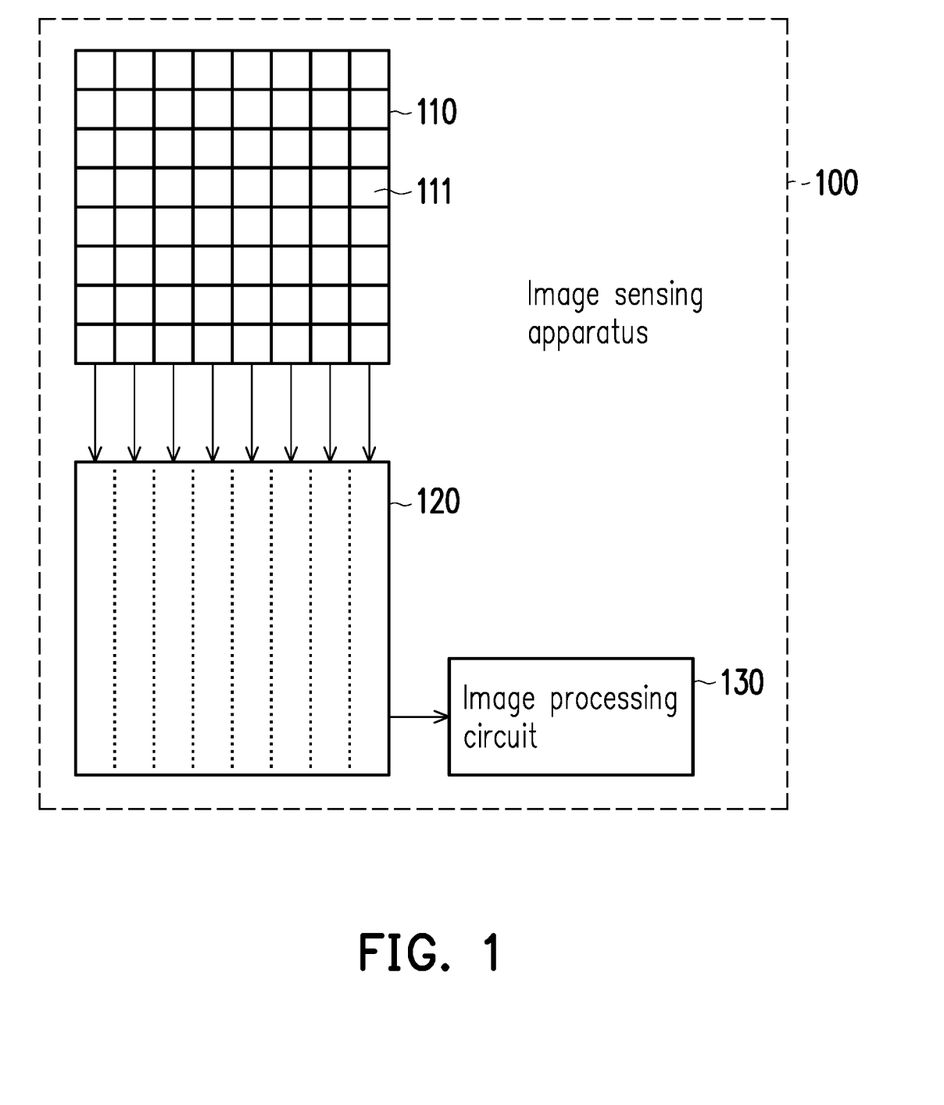
FIG. 1 illustrates a schematic view of an image sensing apparatus according to an embodiment of the present disclosure.

Referring to FIG. 1, an image sensing apparatus 100 is illustrated. The image sensing apparatus 100 includes a pixel array 110, ADCs 120 and an image processing circuit 130. The pixel array 110 may include a plurality of pixels 111 arranged in a matrix structure which has a plurality of pixel columns and a plurality of pixel rows. In an embodiment of the present disclosure, the pixels 111 of the pixel array 110 is designed as a light sensor (e.g., photodiode) that may output an analog pixel signal corresponding to amount of received incident light. The pixel array 110 may be a CMOS pixel array, but the disclosure is not limited thereto. Any type and structure of the pixel array 110 falls within the scope of the present disclosure.

The ADCs 120 may include plurality of column ADCs, where each column ADC is coupled to one the pixel column of the pixel array 110. Each column ADC is configured to convert an analog pixel signal from the pixel column to a corresponding digital signal according to a ramp signal. The column ADCs may be single-slope ADC (SS ADC) which have advantages on small footprint are, simple circuit structure and power efficiency. Beside SS ADC, different kinds of ADC may be used according to the designed needs.

The image processing circuit 130 is coupled to the ADCs 120 to receive the digital signals corresponding to the analog pixel signals in the pixel columns of the pixel array 110. The image processing circuit 130 is configured to perform calculations and operations related to image data on the received digital signal.

Figure 2:
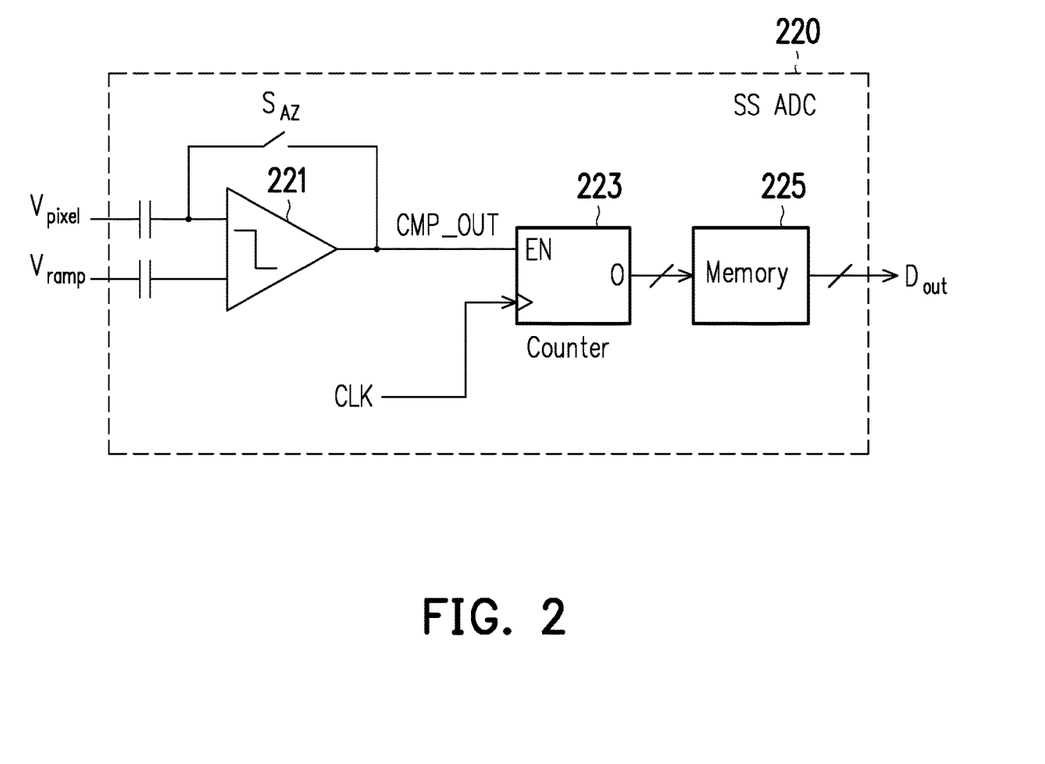
FIG. 2 illustrates a schematic view of an ADC according to an embodiment of the present disclosure.

Referring to FIG. 2, a column ADC 220 receives an analog pixel signal Vpixel and a ramp signal Vramp, and outputs a digital signal Dout. The analog pixel signal Vpixel may be obtained from one of the pixel columns of the pixel array 110. The ramp signal Vramp may be generated by a ramp signal generator (not shown). The analog pixel signal Vpixel and the ramp signal Vramp may be voltage signals.

The column ADC 220 includes a comparator 221, a counter 223 and a memory 225. The comparator 221 receives the analog pixel signal Vpixel and the ramp signal Vramp, and outputs a column comparison signal CMP_OUT by comparing the received pixel signal Vpixel and the ramp signal Vramp. An output terminal of the comparator 221 may be coupled to one of its input terminals (e.g., inverting terminal) via a switch SAZ. When the switch SAZ is closed, the output of the comparator 221 is electrically connected to its inverting input terminal, thereby putting amplifier 211 into a unity gain configuration.

The counter 223 is coupled to the comparator 221 to receive the column comparison signal CMP_OUT. The counter 223 further receives a clock signal CLK (also referred to as a common clock signal CLK), and outputs a counting value according to the comparison signal and the clock signal CLK. The counting value is then stored in the memory 225, and may be used to generate the digital output signal Dout of the ADC 220. In an embodiment of the present disclosure, the counter 223 may be a hybrid counter where the lower bits (e.g., least significant bits) and upper bit (e.g., most significant bits) are counted separately, thereby improving the counting speed and saving power consumption for the counter.

Figure 3:
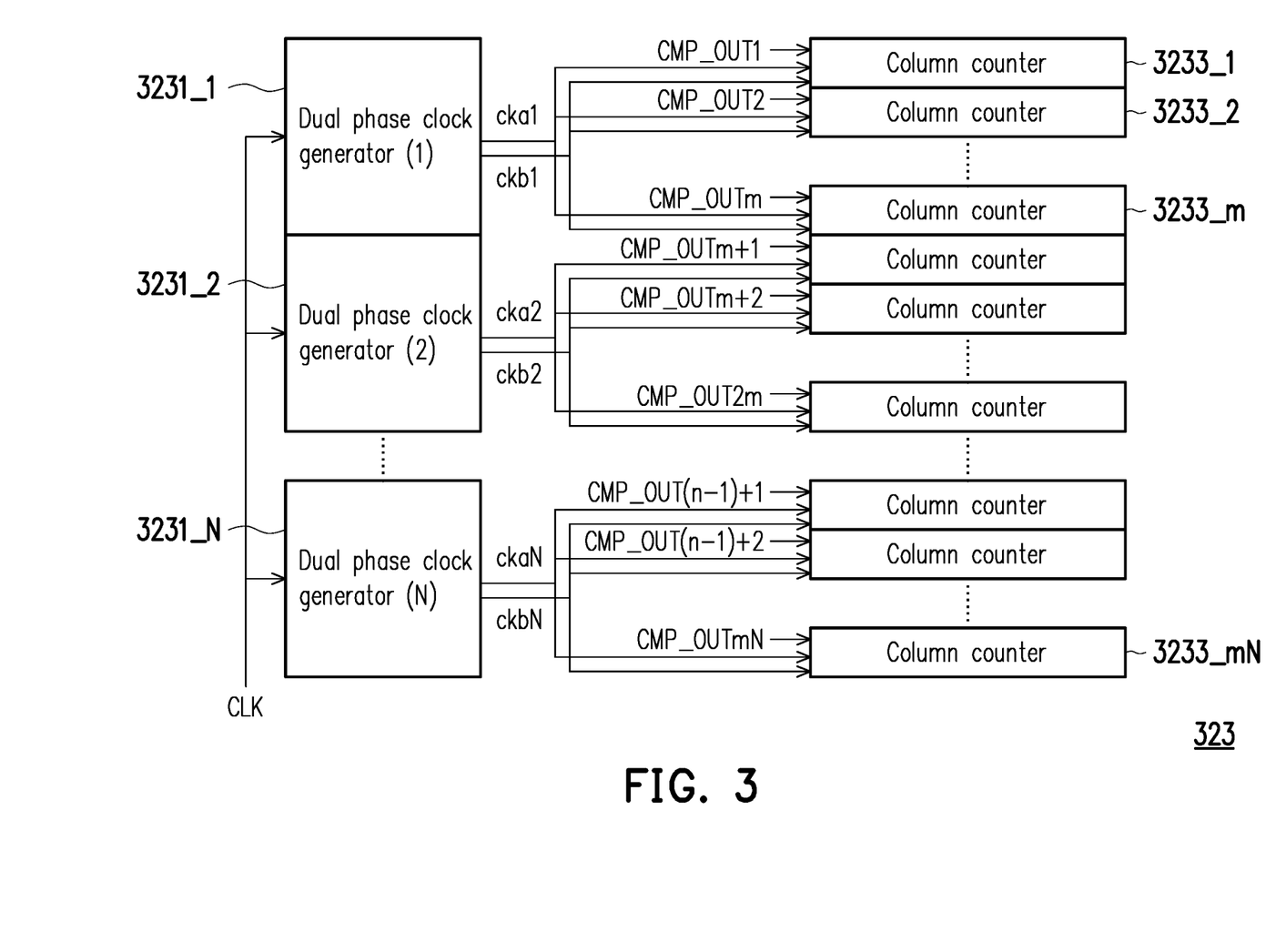
FIG. 3 illustrates a schematic view of a counter of an ADC according to an embodiment of the present disclosure.

Referring to FIG. 3, a counter 323 includes a plurality of dual phase clock generator 3231_1 to 3231_N, and a plurality of column counters 3233_1 to 3233_mN, where N and m are integers. Each of the dual phase clock generators 3231_1 to 3231_N receives the common clock signal CLK and outputs dual phase clock signals and according to the common clock signal CLK, where dual phase clock signals include a first clocks signal cka and a second clock signal ckb. The dual phase clock generator 3231_1 receives the common clock signal CLK and generates dual phase clock signals cka1 and ckb1. The dual phase clock generator 3231_2 generates dual phase clock signals cka2 and ckb2; and the dual phase clock generator 3231_N generates dual phase clock signals ckaN and ckbN.

Each of the dual phase clock generators 3231_1 to 3231_N is coupled to a group of the column counters 3233_1 to 3233_mN. In other words, the dual phase clock signals cka and ckb of each of the dual phase clock generators 3231_1 to 3231_N are shared with a group of the column counters. As shown in FIG. 3, the dual phase clock signals cka1 and ckb1 generated by the dual phase clock generator 3231_1 are shared to the group of m counters 3233_1 to 3233_m; and the dual phase clock signals ckaN and ckbN generated by the dual phase clock generator 3231_N are shared to the group of m counters 3233_m(N−1)+1 to 3233_mN.

In addition to receiving the dual phase clock signals, each of the column counter 3233_1 to 3233_mN may further receive a column comparison signal among the column comparison signals CMP_OUT1 to CMP_OUTmN, so as to output the counting value according to the dual phase clock signals and the corresponding comparison signal. As shown in FIG. 3, the column counter 3233_1 receives the column comparison signal CMP_OUT_1 and the dual phase clock signals cka1 and cka2 to output the counting value of the column counter 3233_1.

Figure 4A:
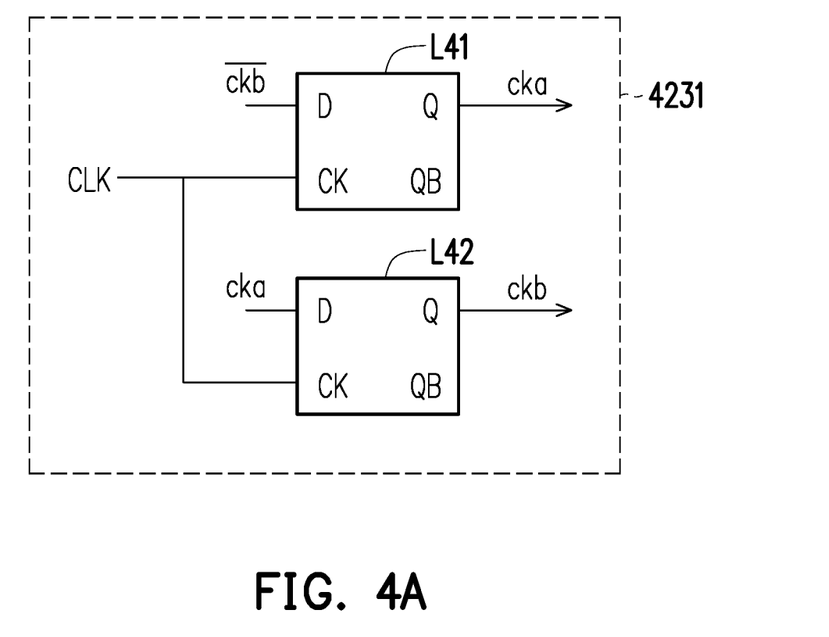
FIG. 4A illustrates a schematic view of a dual phase clock generator of a counter according to an embodiment of the present disclosure.

In FIG. 4A, a dual phase clock generator 4231 includes latches L41 and L42, and is configured to generate dual phase clock signals cka and ckb according to the common clock signal CLK. The latch L41 receives the common clock signal CLK and an inverted clock signal $\overline{ckb}$, and is configured to latch the signal $\overline{ckb}$ to an output terminal of the latch L41 according to the common clock signal CLK. The latch L42 receives the common clock signal CLK and the clock signal cka. The latch L42 latch the clock signal ckb to an output terminal of the latch L42 according to the common clock signal CLK. In this way, the dual phase clock generator 4231 may generate the dual phase clock signals cka and ckb according to the common clock signal CLK.

Figure 4B:
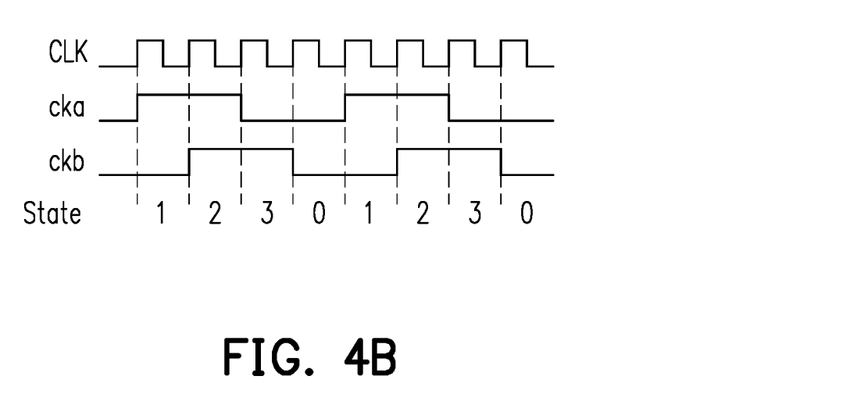
FIG. 4B illustrates waveforms of clock signals outputted by a dual phase clock generator according to an embodiment of the present disclosure.

FIG. 4B illustrates waveforms of the common clock signal CLK and the dual phase clock signals cka and ckb according to an embodiment of the present disclosure. The dual phase clock signals cka and ckb have a same frequency; and a frequency of the common clock signal CLK may be four times higher than the frequency of the dual phase clock signals cka and ckb. The dual phase clock signals cka and ckb have different phases. Since the phase of the clock signal cka is different from the phase of the clock signal ckb, the dual phase clock signals cka and ckb may generate four different operating states which are summarized in the Table 1.

TABLE 1

| cka | ckb | Operating states |
|-----|-----|------------------|
| 1   | 0   | 1                |
| 1   | 1   | 2                |
| 0   | 1   | 3                |
| 0   | 0   | 0                |

It should be noted that the levels of clock signals cka and ckb are two-bit gray code, where the two successive values differ in only one bit. In other word, when one of the clock signals cka and ckb changes its state (e.g., from a low logical state to a high logical state or from the high logical state to the low logical state), the another one of the lock signals cka and ckb does not change its state. As an example shown in FIG. 4B, when the clock signal ckb change from the low logical state to the high logical state, the clock signal cka remains at high logical state; and when the clock signal ckb changes from the high logical state to the low logical state, the clock signal cka remains at the low logical state.

In FIG. 4A and FIG. 4B, the dual phase clock generator 4231 is two-bit clock generator for generating two clock signals which correspond to four operating states. However, the present disclosure is not limited therefore, and dual phase clock generator 4231 may be a n-bit clock generator for generating n clock signals which corresponds to $2^n$ operating states, where n is an integer.

Figure 5:
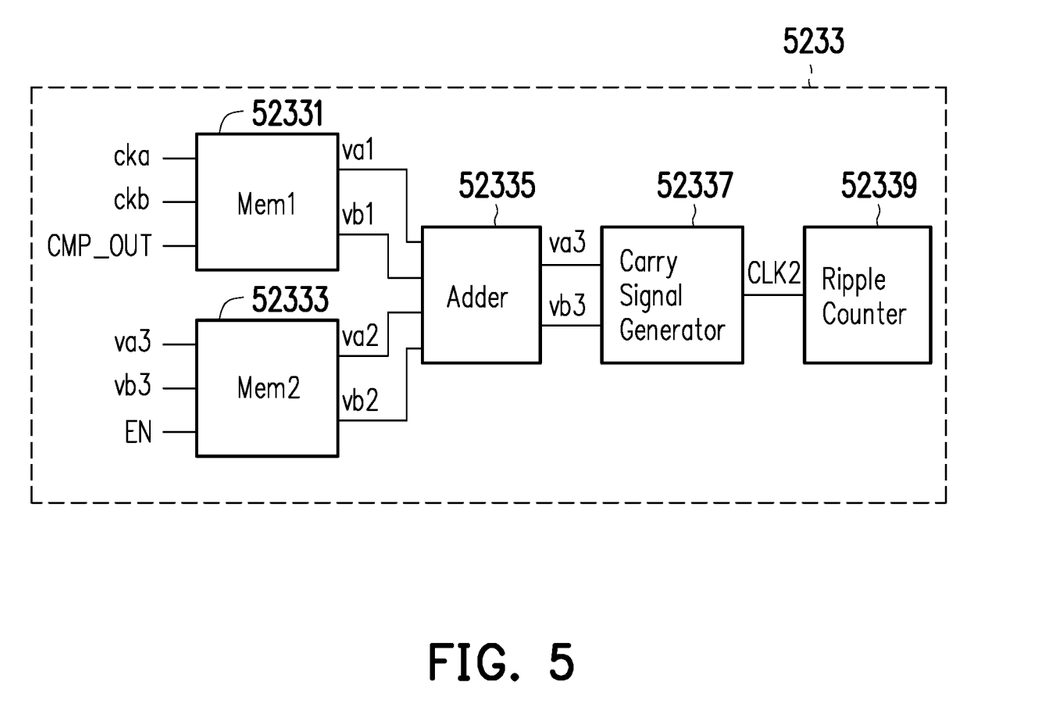
FIG. 5 illustrates a schematic view of a column counter according to an embodiment of the present disclosure.

FIG. 5 shows a column counter 5233 according to an embodiment of the present disclosure. The column counter 5233 includes a first memory 52331, a second memory 52333, an adder 52335, a carry signal generator 52337 and a ripple counter 52339. The first memory 52331 receives the column comparison signal CMP_OUT and the dual phase clock signals cka and ckb, and outputs dual phase signals va1 and vb1 according to the column comparison signal CMP_OUT and the dual phase clock signals cka and ckb. The second memory 52333 stores the dual phase signals va3 and vb3, and configured to output the dual phase signals va2 and vb2 to the adder 52335.

The adder 52335 is coupled to the first memory 52331 and the second memory 52333 to receive the signals va1 and vb1 from the first memory 52331 and the signals va2 and vb2 from the second memory 52333. The adder 52335 performs an adding operation on the signals va1, vb1, va2 and vb2 to generate the added dual phase signals va3 and vb3. In an embodiment of the present disclosure, the adder 52335 performs the formulas (1) and (2) to generate the dual phase signals va3 and vb3.

$$va3=\overline{va2}*\overline{vb2}*va1+va2*\overline{vb2}*\overline{vb1}+va2*vb2*\overline{va1}+ \overline{va2}*vb2*vb1 \qquad (1)$$

$$vb3=\overline{va2}*\overline{vb2}*vb1+va2*\overline{vb2}*va1+va2*vb2*\overline{vb1}+ \overline{va2}*vb2*\overline{va1} \qquad (2)$$

In the formulas (1) and (2), $\overline{va1}$, $\overline{vb1}$, $\overline{va2}$, $\overline{vb2}$ are the inverted signals of va1, vb1, va2 and vb2 respectively.

Output terminals of the adder 52335 may be coupled to the second memory 52333 so that the added dual phase signals va3 and vb3 may be fed back and stored in the second memory 52333. In next sampling operation, the signals stored in the second memory 52333 may be provided to the adder 52335 to generate new added dual phase signals va3 and vb3.

The carry signal generator 52339 is coupled to the adder 52335 to receive the added dual phase signals va3 and vb3 and generate a carrying signal CLK2 according to the added dual phase signals va3 and vb3.

The ripple counter 52339 is coupled to the carry signal generator 52337 to receive the carrying signal CLK2. The ripple counter 52339 performs a counting operation on the carrying signal CLK2 to output a counting value. For example, the counting value may include least significant bits (LSBs) and most significant bits (MSBs), wherein the LSBs may be determined according to the dual phase signals va3 and vb3; and the MSBs may be determined according to the carrying signal CLK2. For example, MSBs may be determined according to number of pulses in the carrying signal CLK2. The counting value may be obtained according to the following formula (3), wherein $D_{final}$ is the counting value; $D_{ripple}$ represents MSBs; $D_{LSB}$ represent LSBs; and k represents a number of bits.

$$D_{final}=D_{ripple}*2^k+D_{LSB} \quad (3)$$

Figure 6:
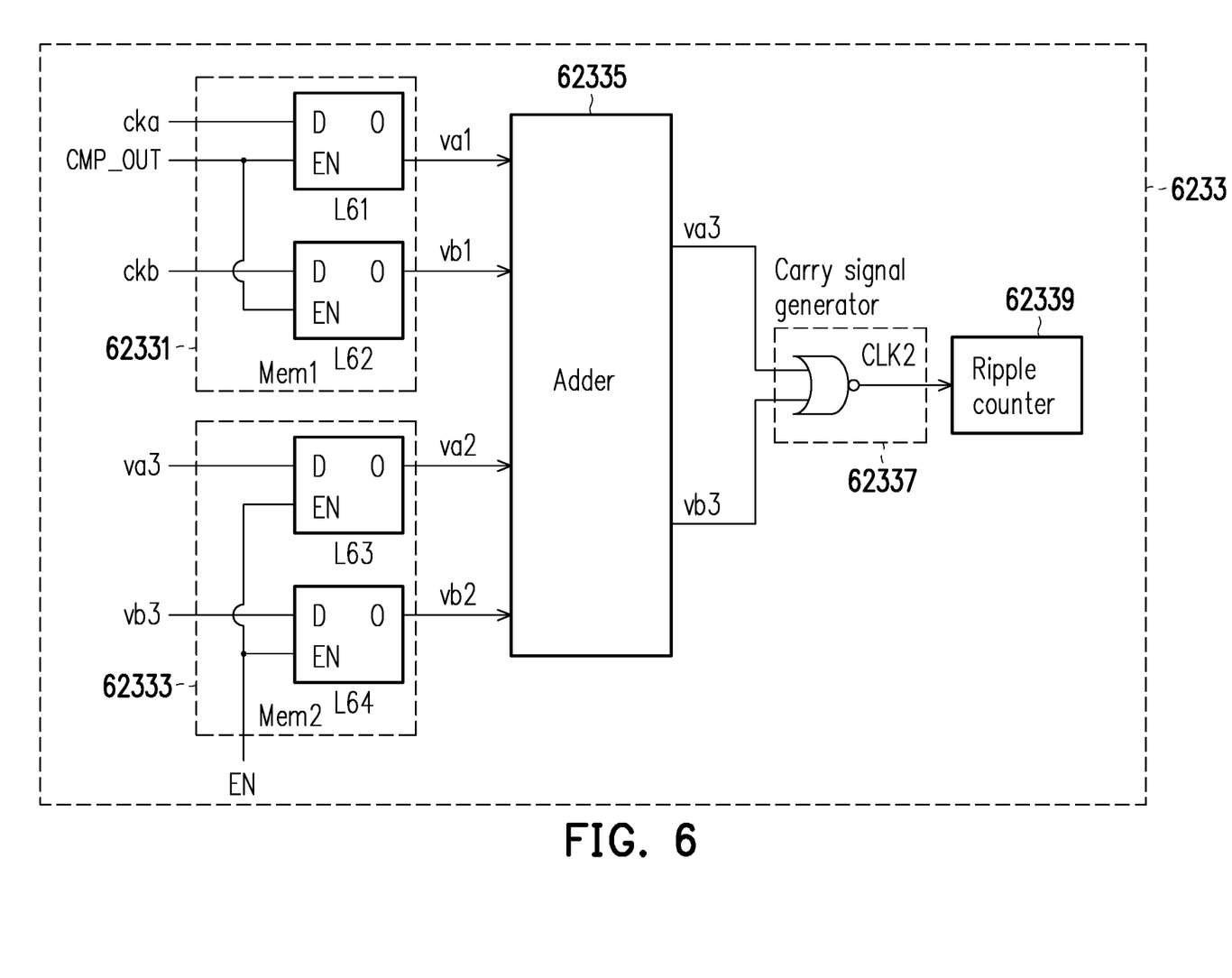
FIG. 6 illustrates detailed structures of a column counter according to an embodiment of the present disclosure.

FIG. 6 shows detailed structures of a column counter 6233. The column counter 6233 includes a first memory 62331, a second memory 62333, an adder 62335, a carry signal generator 62337 and a ripple counter 62339. The first memory 62331 includes a latch L61 and a latch L62, where both of the latches L61 and L62 receives the column comparison signal CMP_OUT. The latch L61 further receives the clock signal cka and latches the clock signal cka to output the phase signal va1 according to the column comparison signal CMP_OUT; and the latch L62 further receives the clock signal ckb and latches the clock signal ckb to output the phase signal vb1 according to the column comparison signal CMP_OUT.

The second memory 62333 may include latches L63 and L64 which receives the same enable signal EN. The latch L63 is configured to latch the signal va3 fed back from the adder 62335 according to the enable signal EN; and the latch L64 is configured to latch the signal vb3 fed back from the adder 62335 according to the enable signal EN. It should be noted that the column counter 6233 may be operated in a correlated multiple sampling (CMS) operation. The dual phase signals va1 and vb1 in a current sampling operation of the CMS operation are added to previous sampling data va2 and vb2 by adder 62335. The dual phase signals va3 and vb3 are adder 62335 output. The latches L61 to L64 may be D flip flops, but the present disclosure is not limited thereto.

The carry signal generator 62339 may include a logical gate and the carrying signal CLK2 is generated by performing a logical operation. For example, the logical gate may be a NOR gate, and carry signal generator 62339 performs a NOR operation on the added dual phase signals va3 and vb3 to generate the carrying signal CLK2. A truth table of the NOR gate is listed in the Table 2.

TABLE 2

| va3 | vb3 | CLK2 |
|---|---|---|
| 0 | 0 | 1 |
| 0 | 1 | 0 |
| 1 | 0 | 0 |
| 1 | 1 | 0 |

Figure 7:
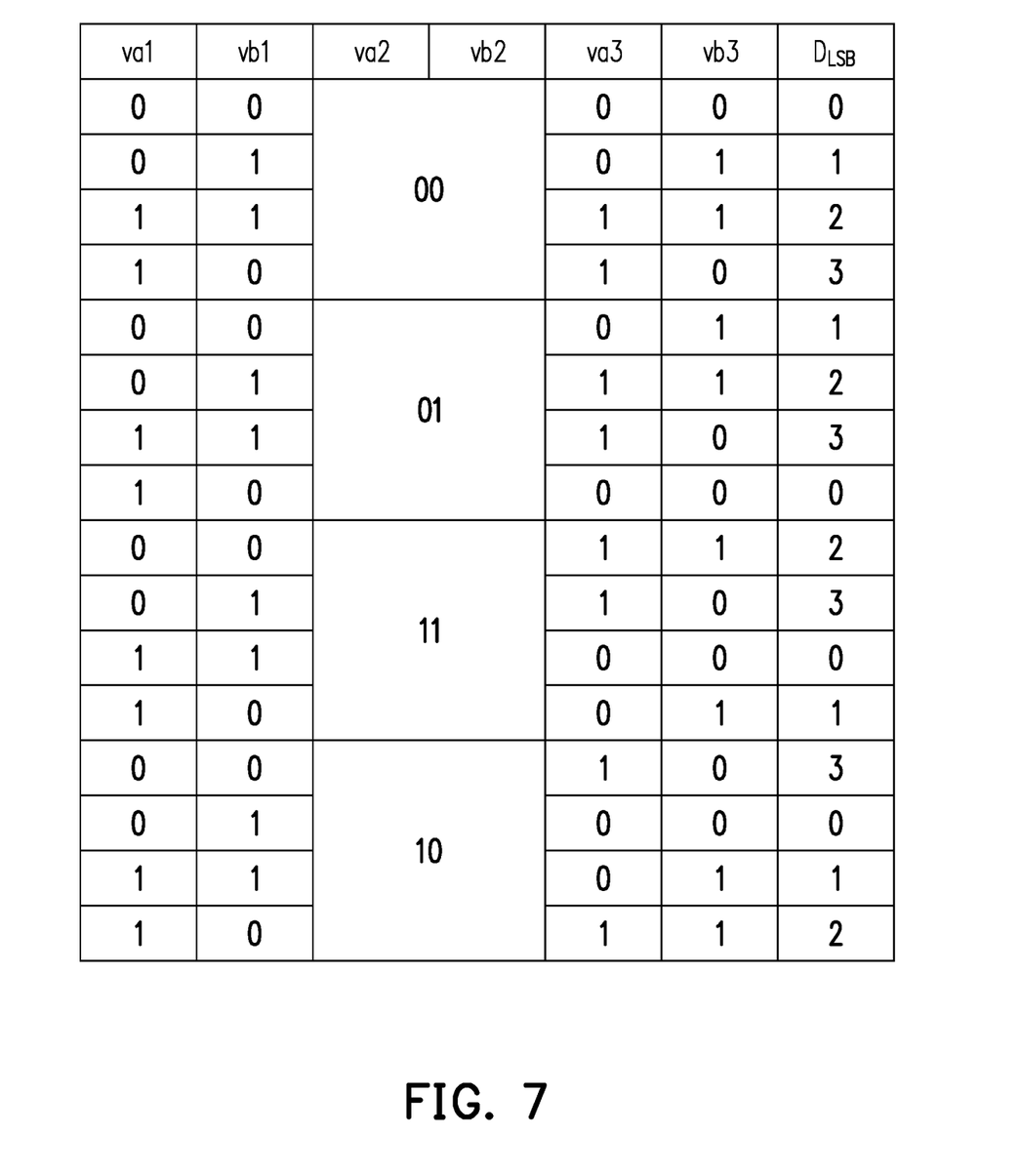
FIG. 7 illustrates a lookup table of dual phase signals according to an embodiment of the present disclosure.

FIG. 7 illustrates a look-up table or a truth table of the column counter 6233 according to an embodiment of the present disclosure. When va1, vb1, va2 and vb2 are provided, va3, vb3 and LSB $D_{LSB}$ may be obtained according to the look-up table. It should be noted that the values of va3, vb3 shown in FIG. 7 are calculated according to the formulas (1) and (2) respectively, and the value of $D_{LSB}$ is counted by the ripple counter 62339. The look-up table in FIG. 7 may be stored in a memory so as to quickly obtain the values of va3, vb3 and $D_{LSB}$ when va1, vb1, va2 and vb2 are provided.

Figure 8:
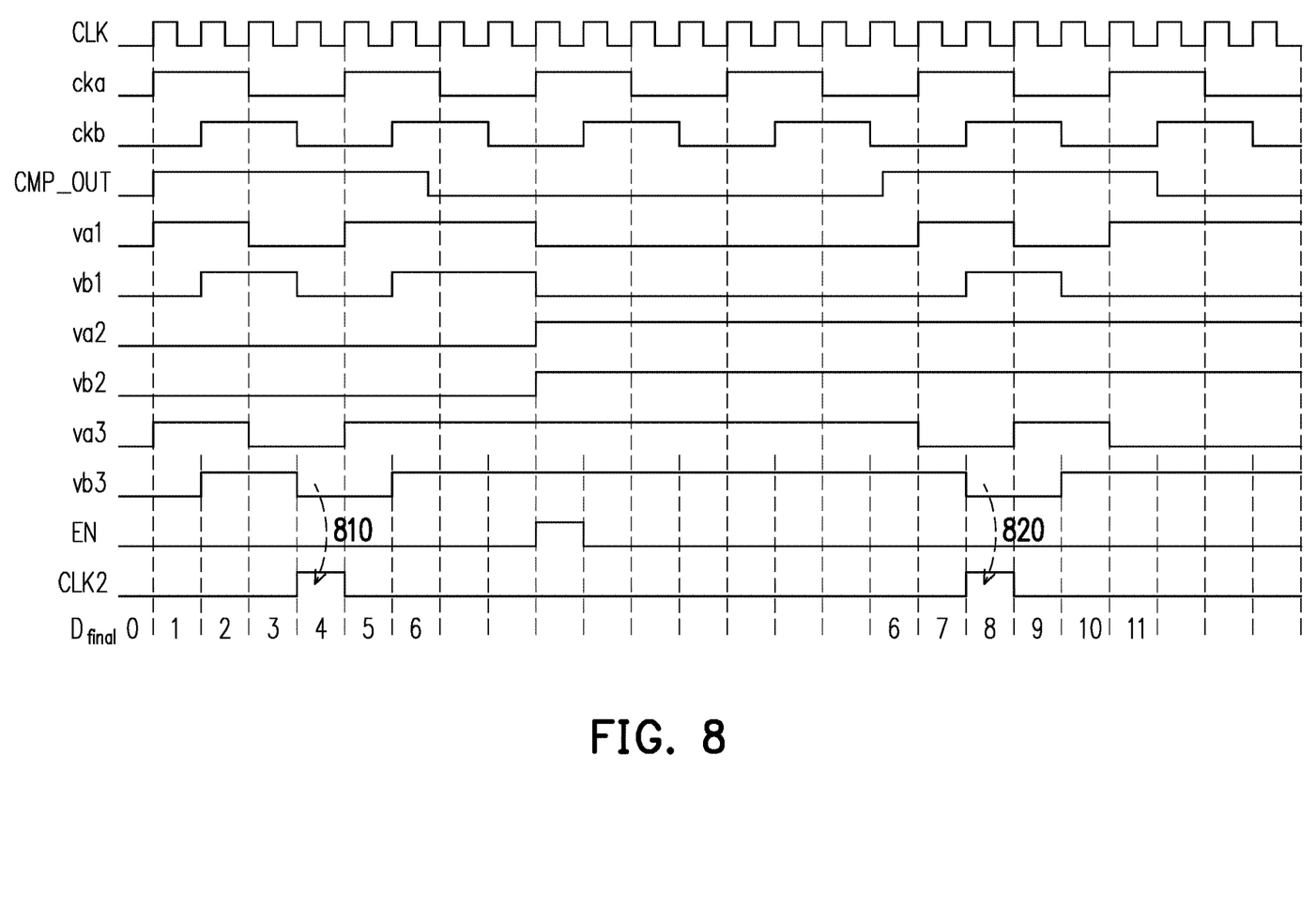
FIG. 8 illustrates waveforms of clock signals and dual phase signals according to an embodiment of the present disclosure.

Referring to FIG. 8, waveforms of the signals of a counter is illustrated. Once the column comparison signal CMP_OUT is obtained, the signals va1 and vb1 are determined according to the comparison signal CMP_OUT, and the clock signals cka and ckb; and the signals va2 and vb2 are retrieved from the second memory. The signals va3 and vb3 are calculated according to the formulas (1) and (2), and are used for determining the LSBs of the counting value. The enable signal EN is used to store the calculated signals va3 and vb3 to the second memory so as to be used in next sampling operation. The carrying signal CLK2 is obtained by performing a logical operation (e.g., NOR operation) on the signals va3 and vb3; and the MSBs of the counting value may be determined according to the carrying signal CLK2. The counting value is then determined according to the LSBs and MSBs.

As shown in FIG. 8 and Table 2, when the signals va3 and vb3 are both in the low logical state, a pulse is generated in the carrying signal CLK2 (e.g., state of the carrying signal CLK2 changes from the low logical state to the high logical state and then back to low logical state). Arrows 810 and 820 illustrates state transitions of the carrying signal CLK2 in response to signals va3 and vb3 are in the low logical state. The number of pulses on the carrying signal CLK2 may be used to determine the MSBs of the counting value.

Figure 9A:
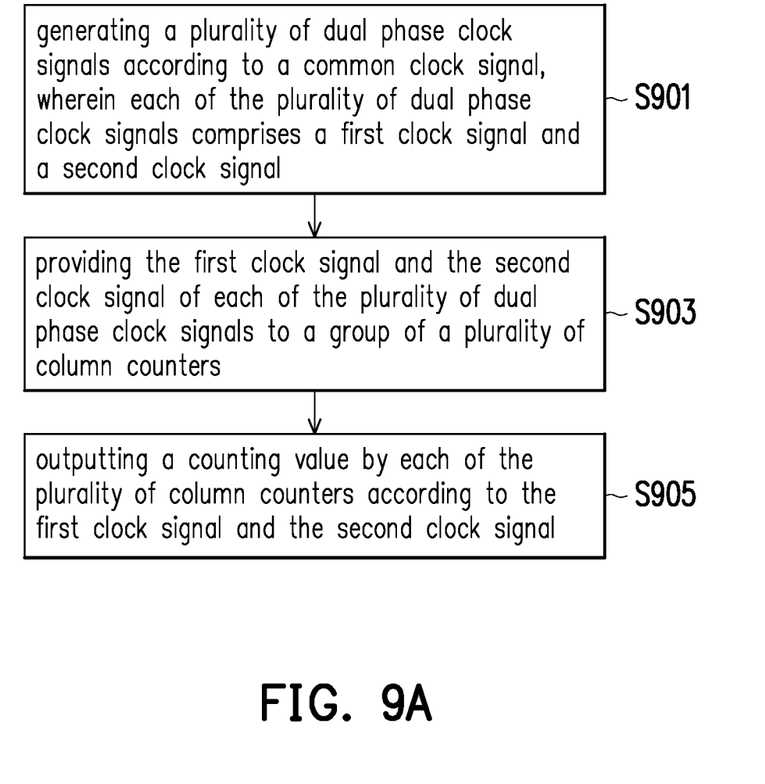
FIG. 9A to FIG. 9B illustrate a counting method according to an embodiment of the present disclosure.

FIG. 9A illustrates a counting method adapted to a counter in an ADC according to an embodiment of the present disclosure. In step S901, a plurality of dual phase clock signals is generated according to a common clock signal, wherein each of the dual phase clock signals comprises a first clock signal and a second clock signal. In step S903, the first clock signal and the second clock signal are provided to each of the dual phase clock signals to a group of a plurality of column counters. In step S905, a counting value is outputted by each of the column counters according to the first clock signal and the second clocks signal.

Figure 9B:
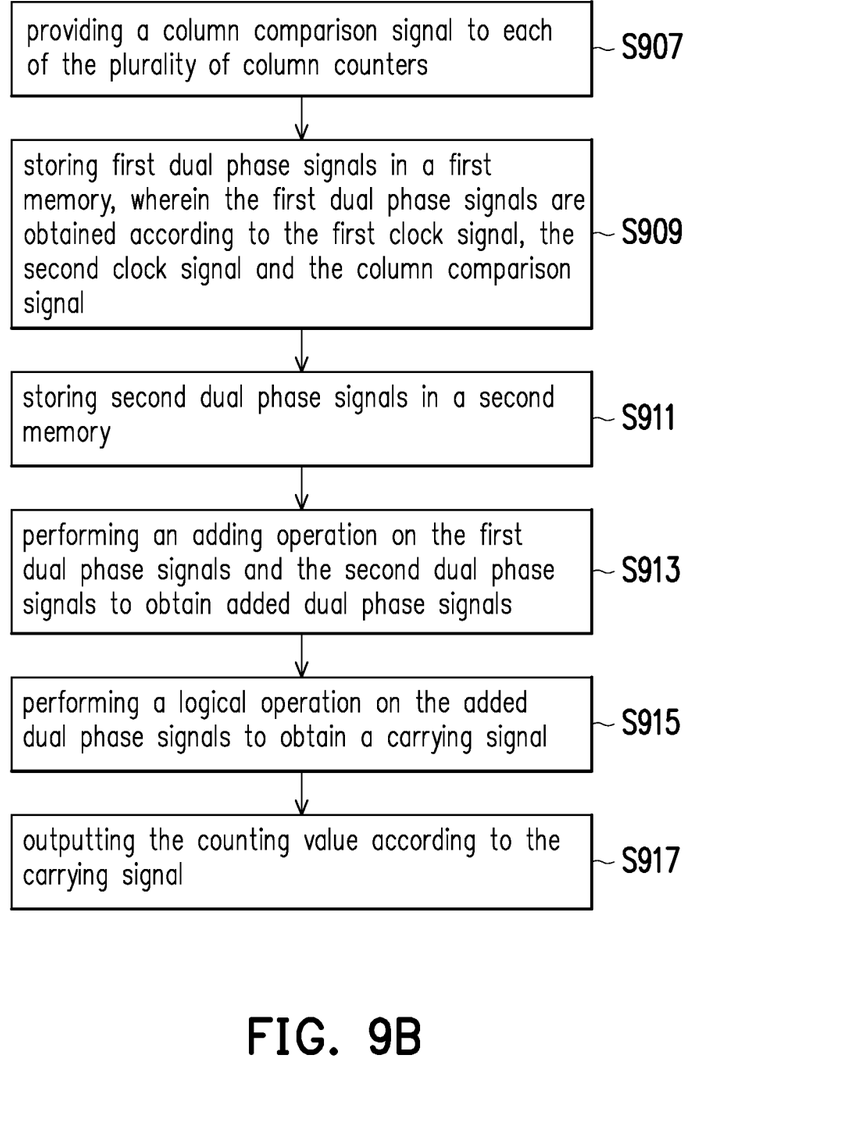

FIG. 9B illustrates additional steps of the counting method in FIG. 9A. In step S907, a column comparison signal is provided to each of the plurality of column counters. In step S909, first dual phase signals which are obtained according to the first clock signal, the second clock signal and the column comparison signal are stored in the first memory. In step S911, second dual phase signals are stored in the second memory. In step S913, an adding operation is performed on the first dual phase signals and the second dual phase signals to obtain added dual phase signals. In step S915, a logical operation is performed on the added dual phase signals to obtain a carrying signal. In step S917, the counting value is outputted according to the carrying signal.

Figure 10:
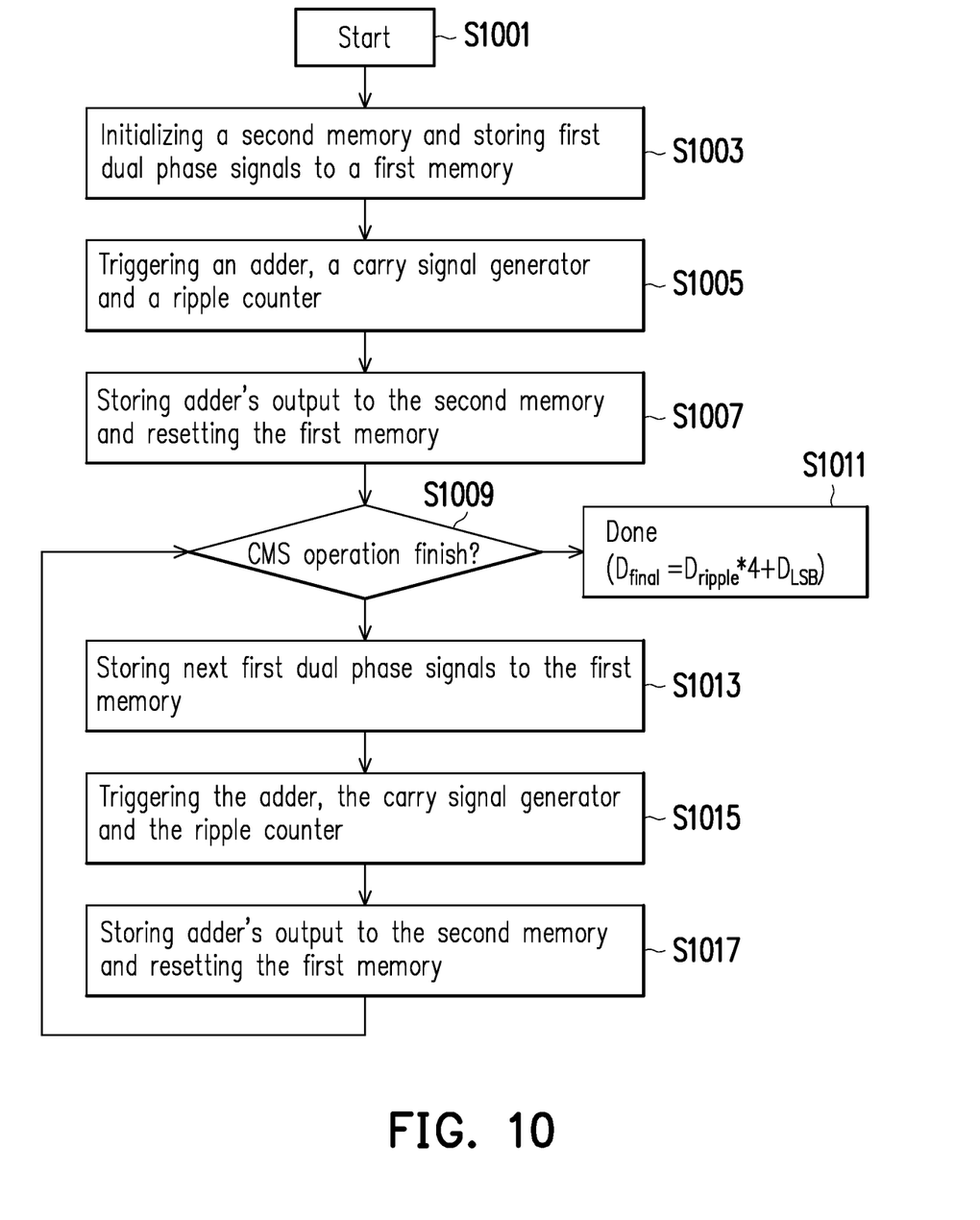
FIG. 10 illustrates a flowchart for a counting method using a counter according to an embodiment of the present disclosure.

FIG. 10 illustrates a flowchart of a counting method in a CMS operation according to an embodiment of the present disclosure. Referring to FIG. 6 and FIG. 10, in steps S1001 and S1003, the counter is started; the second memory 62333 is initialized; and the first memory 62331 stores the first dual phase signals va1 and vb1. In step S1005, the adder 62335, the carry signal generator 62337 and the ripple counter 62339 are triggered to determine the added dual phase signal va3, vb3 and the carrying signal CLK2 and the LSBs, MSBs of the counting value. In step S1007, the added dual phase signal va3, vb3 are fed back to be stored in the second memory 62333, and the first memory 62331 are reset and ready for storing the next first dual phase signals. In step S1009, the method determines whether the CMS operation is finished. If the multiple sampling operation is finished, the counting value is calculated in step S1011 according to the formula (3). If multiple sampling operation has not finished yet, a next sampling operation of the CMS operation is performed in steps S1013 to S1017. In step S1013, the first memory 62331 stores the first dual phase signals va1 and vb1; the second memory 62333 stores the second dual phase signals va2 and vb2 (which are the added dual phase signal va3 and vb3 in the previous sampling operation). In step S1017, the adder 62335, the carry signal generator 62337 and the ripple counter 62339 are trigger to output the added dual phase signals va3, vb3, the carrying signal CLK2, the LSBs and MSBs of the counting value. Steps S1009 to S1017 are repeated until the CMS operation is finished.

According to some embodiments of the present disclosure, a counter of a ADC is introduced. The counter may include a plurality of dual phase clock generators, where each of the plurality of dual phase clock generators receives a common clock signal and generates dual phase clock signals comprising a first clock signal and a second clock signal according to the common clock signal. The counter may further include a plurality of column counters, where each of the plurality of column counters is coupled to one of the plurality of dual phase clock generators to receive the first clock signal and the second clock signal. Each of the plurality of column counters is configured to output a counting value according to the first clock signal and the second clock signal; and each of the plurality of column counters provides the first clock signal and the second clock signal to a group of the plurality of column counters. By configuring the plurality of dual phase clock generators to generate dual clock signals according to the common clock signal CLK which is a high speed clock signal, the loading for the high speed clock signal CLK is reduced, the power consumption is reduced, and the counting speed of the counter is significantly improved. In addition, by sharing the dual phase clock signals generated by each of the dual phase clock generators to the group of column counters, the power consumption of the counter is further reduced. As a result, the counting speed and the power consumption of the counter in embodiments of the present disclosure are significantly improved.

According to some embodiments of the present disclosure, a counting method adapted to a counter having a plurality of column counters in an ADC is introduced. The counting method comprises following steps: generating a plurality of dual phase clock signals according to a common clock signal, wherein each of the dual phase clock signals comprises a first clock signal and a second clock signal; providing the first clock signal and the second clock signal of each of the dual phase clock signals to a group of a plurality of column counters; and, outputting a counting value by each of the column counters according to the first clock signal and the second clocks signal.

According to some embodiments of the present disclosure, an image sensing apparatus is introduced. The image sensing apparatus comprises an ADC converter having a counter. The counter comprises a plurality of dual phase clock generators and a plurality of column counters, Each of the plurality of dual phase clock generators is configured to receive a common clock signal and output a first clock signal and a second clock signal according to the common clock signal. Each of the plurality of column counters is coupled to one of the plurality of dual phase clock generators to receive the first clock signal and the second clock signal, and each of the plurality of column counters is configured to output a counting value according to the first clock signal and the second clock signal. Each of the plurality of dual phase clock generators provides the first clock signal and the second clock signal to a group of the plurality of column counters.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A counter of an analog-to-digital converter (ADC), comprising:
    a plurality of dual phase clock generators, each of the plurality of dual phase clock generators receives a common clock signal and generates dual phase clock signals comprising a first clock signal and a second clock signal according to the common clock signal; and
    a plurality of column counters, each of the plurality of column counters is coupled to one of the plurality of dual phase clock generators to receive the first clock signal and the second clock signal, and each of the plurality of column counters is configured to output a counting value according to the first clock signal and the second clock signal,
    wherein each of the plurality of dual phase clock generators provides the first clock signal and the second clock signal to a group of the plurality of column counters, and each of the plurality of column counters comprises:
    a first memory, storing first dual phase signals;
    a second memory, storing second dual phase signals;
    an adder, coupled to the first memory and the second memory, performing an adding operation on the first dual phase signals and the second dual phase signals to generate added dual phase signals;
    a carry signal generator, coupled to the adder, generating a carrying signal according to the added dual phase signals; and
    a ripple counter, coupled to the carrying signal generator, outputting the counting value according to the carrying signal.

2. The counter of claim 1, wherein the first clock signal and the second clock signal have the same frequency, the first clock signal and the second clock signal have different phases, and the frequency of the first clock signal and the second clock signal is smaller than a frequency of the common clock signal.

3. The counter of claim 1, wherein each of the plurality of dual phase clock generators comprises:
    a first latch, receiving the common clock signal and an inverted signal of the second clock signal, and outputting the first clock signal according to the common clock signal and the inverted signal of the second clock signal; and
    a second latch, receiving the common clock signal and the first clock signal, and outputting the second clock signal according to the common clock signal and first clock signal.

4. The counter of claim 1, wherein each of the plurality of column counters is further provided with a column comparison signal which corresponds to a pixel column of a pixel array, and each of the plurality of column counters outputs the counting value according to the column comparison signal, the first clock signal and the second clock signal.

5. The counter of claim 1, wherein the first memory comprises:
a third latch, receiving the first clock signal and the column comparison signal, and outputting one of the first dual phase signals according to the column comparison signal and the first clock signal; and
a fourth latch, receiving the second clock signal and the column comparison signal, and outputting another one of the first dual phase signals according to the column comparison signal and the second clock signal.

6. The counter of claim 1, wherein the second memory comprises:
a fifth latch, coupled to receive an enable signal and one of the added dual phase signals, storing one of the second dual phase signals, wherein the one of the second dual phase signals in a current sampling operation of a correlated multiple sampling (CMS) operation is the one of the added dual phase signals in a previous sampling operation of the CMS operation; and
a sixth latch, coupled to receive the enable signal and another one of the added dual phase signal, storing another one of the second dual phase signals, wherein the another one of the second dual phase signals in the current sampling operation of the CMS operation is the another one of the added dual phase signals in the previous sampling operation of the CMS operation.

7. The counter of claim 1, wherein the carry signal generator comprises a logical gate which performs a logical operation on the added dual phase signals to generate the carrying signal.

8. A counting method adapted to a counter having a plurality of column counters in an analog-to-digital converter (ADC), wherein each of the plurality of column counters comprises a first memory and the second memory, the counting method comprising:
generating a plurality of dual phase clock signals according to a common clock signal, wherein each of the dual phase clock signals comprises a first clock signal and a second clock signal;
providing the first clock signal and the second clock signal of each of the dual phase clock signals to a group of a plurality of column counters;
outputting a counting value by each of the plurality of column counters according to the first clock signal and the second clocks clock signal;
storing first dual phase signals in the first memory;
storing second dual phases signal in the second memory;
performing an adding operation on the first dual phase signals and the second dual phase signals to obtain added dual phase signals; and
performing a logical operation on the added dual phase signals to obtain a carrying signal, wherein the counting value is outputted according to the carrying signal.

9. The counting method of claim 8, wherein the first clock signal and the second clock signal have the same frequency, the first clock signal and the second clock signal have different phases, and the frequency of the first clock signal and the second clock signal is smaller than a frequency of the common clock signal.

10. The counting method of claim 8, further comprising: providing a column comparison signal to each of the plurality of column counters,
wherein the first dual phase signals are obtained according to the first clock signal, the second clock signal and the column comparison signal.

11. The counting method of claim 10, wherein the second dual phase signals in a current sampling operation of a correlated multiple sampling (CMS) operation are the added dual phase signals in a previous sampling operation of the CMS operation.

12. The counting method of claim 10, wherein after the step of performing the adding operation on the first dual phase signals and the second dual phase signals to obtain the added dual phase signals, the method further comprising:
resetting the first memory; and
storing the added dual phase signals in the second memory according to an enable signal.

13. The counting method of claim 10, wherein the step of performing the logical operation on the added dual phase signals to obtain the carrying signal comprises:
performing a NOR operation on the added dual phase signals to obtain the carrying signal.

14. The counting method of claim 11, wherein the each of the plurality of column counters comprises a ripple counter, and the step of outputting the counting value according to the carrying signal comprises:
generating a least significant bit (LSB) value according to the added dual phase signals;
generating a most significant bit (MSB) value according to the carrying signal; and
outputting the counting value according to the LSB value and the MSB value.

15. An image sensing apparatus, comprising:
an analog-to-digital (ADC) converter having a counter, the counter comprises:
a plurality of dual phase clock generators, each of the plurality of dual phase clock generators is configured to receive a common clock signal and output a first clock signal and a second clock signal according to the common clock signal; and
a plurality of column counters, each of the plurality of column counters is coupled to one of the plurality of dual phase clock generators to receive the first clock signal and the second clock signal, and each of the plurality of column counters is configured to output a counting value according to the first clock signal and the second clock signal,
wherein each of the plurality of dual phase clock generators provides the first clock signal and the second clock signal to a group of the plurality of column counters, and each of the plurality of column counters comprises:
a first memory, storing first dual phase signals;
a second memory, storing second dual phase signals;
an adder, coupled to the first memory and the second memory, performing an adding operation on the first dual phase signals and the second dual phase signals to generate added dual phase signals;
a carry signal generator, coupled to the adder, generating a carrying signal according to the added dual phase signals; and
a ripple counter, coupled to the carrying signal generator, outputting the counting value according to the carrying signal.

16. The image sensing apparatus of claim 15, further comprising:
a pixel array, comprising a plurality of pixel columns, wherein each of the plurality of column counters is further provided with a column comparison signal corresponding to each of the plurality of pixel columns, wherein the column comparison signal is obtained by comparing a pixel value and a reference value, and each of the plurality of column counters outputs the counting value according to the column comparison signal, the first clock signal and the second clock signal.

17. The image sensing apparatus of claim 15, wherein the first clock signal and the second clock signal have the same frequency, the first clock signal and the second clock signal have different phases, and the frequency of the first clock signal and the second clock signal is smaller than a frequency of the common clock signal.

* * * * *